United States Patent
Chen

(10) Patent No.: US 7,362,136 B2
(45) Date of Patent: Apr. 22, 2008

(54) DUAL VOLTAGE SINGLE GATE OXIDE I/O CIRCUIT WITH HIGH VOLTAGE STRESS TOLERANCE

(75) Inventor: Ker-Min Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 79 days.

(21) Appl. No.: 11/397,213

(22) Filed: Apr. 4, 2006

(65) Prior Publication Data

US 2007/0247190 A1 Oct. 25, 2007

(51) Int. Cl.
*H03K 19/094* (2006.01)

(52) U.S. Cl. .......................................... 326/81; 326/68
(58) Field of Classification Search ................. 326/68, 326/81
See application file for complete search history.

(56) References Cited

U.S. PATENT DOCUMENTS 6,313,671 B1* 11/2001 Le et al. ...................... 327/112
6,924,669 B2* 8/2005 Itoh et al. ..................... 326/87

OTHER PUBLICATIONS

Annema, et al., "5.5-V I/O in a 2.5-V 0.25-µm CMOS Technology", IEEE Journal of Solid-State Circuits, vol. 36, No. 3, Mar. 2001, pp. 528-538.
Ker, et al., "Design of 2.5V/5V Mixed-Voltage CMOS I/O Buffer with Only Thin Oxide Device and Dynamic N-Well Bias Circuit", Nanoelectronics and Gigascale System Lab, Inst. Of Electronics, Nat'l Chiao-Tung, Taiwan, IEEE (2003), pp. V-97-V-100.
Lee, et al., "A Stabilization Technique for Phase-Locked Frequency Synthesizers", IEEE Journal of Solid-State Circuits, vol. 38, No. 6, Jun. 2003, pp. 888-894.

* cited by examiner

*Primary Examiner*—James Cho
*Assistant Examiner*—Thienvu V Tran
(74) *Attorney, Agent, or Firm*—Howard Chen, Esq.; Ting-Mao Chao, Esq.; Kirkpatrick & Lockhart Preston Gates Ellis LLP

(57) ABSTRACT

An I/O output circuit is disclosed for interfacing a first system operating at a first voltage with a second system operating at a second voltage higher than the first voltage. The I/O output circuit includes an output stage module having one or more PMOS transistors and one or more NMOS transistors for coupling with the second system. A switch module is coupled to the output stage module for selectively providing the PMOS and NMOS transistors with various gate biases. A feedback circuit is coupled between an I/O pad that couples the output stage module to the second system and the switch module for controlling the switch module to generate the gate biases in response to a voltage at the I/O pad, thereby ensuring voltages across gates of the PMOS and NMOS transistors to be within a predetermined range.

11 Claims, 5 Drawing Sheets

DUAL VOLTAGE SINGLE GATE OXIDE I/O CIRCUIT WITH HIGH VOLTAGE STRESS TOLERANCE

BACKGROUND

The present invention relates generally to integrated circuits (ICs), and more particularly to a dual voltage single gate oxide input/output (I/O) circuit with high voltage stress tolerance.

Devices in different IC packages are interconnected to one another at I/O pads that interface with various electrical circuits performing certain functions. It is common for such interconnected circuits to utilize standard voltage levels for representing logic states of "0" and "1." Common standard voltage levels in the past have been set to 0 V for representing zero logic state and 5V for representing the one logic state. As new IC manufacturing technologies evolve, the voltage levels used to represent a logic one state have been reduced to, for example, 3.3V, 2.5V, or 1.8 V. The lower voltage levels permit reduced thickness in the gate oxide of transistor, thereby reducing the transistor switching time and power consumption. However, as IC design quickly migrates to the lower voltage realm, some peripheral components still operate with the higher voltages such as 3.3V and 5V. As a result, a system often includes circuits that operate at different voltages.

A metal-oxide-semiconductor (MOS) transistor is typically composed of a conductor, insulator, and semiconductor. When a voltage is applied to the conductor of the MOS transistor, a depletion region is formed under the insulator in the semiconductor. When the applied voltage is increased to a certain level (threshold voltage), a conductive channel is created in the semiconductor between source and drain regions. When the applied voltage further exceeds a certain level (breakdown voltage), it can cause the insulator to break down, and the MOS transistor to fail.

In a system having circuits operating with different voltages, an I/O circuit is typically used to interface these circuits in order to prevent the devices in the low voltage circuit from damage induced by the high voltage of another circuit. Conventionally, the gate oxide of the MOS transistor in the I/O circuit is thicker than that of the devices in other circuits for withstanding high voltage inputs. This is the so called dual gate oxide technology. However, the main drawback of the dual gate oxide technology is that two separate sets of masks are required for the thick and thin oxide MOS transistors. This increases the manufacturing costs and decreases the product yield rates.

As such, what is needed is an I/O circuit constructed by single gate oxide technology with high voltage stress tolerance.

SUMMARY

The present invention discloses an I/O circuit for interfacing two circuit systems. In one embodiment of the invention, an I/O output circuit is proposed for interfacing a first system operating at a first voltage with a second system operating at a second voltage higher than the first voltage. The I/O output circuit includes an output stage module having one or more PMOS transistors and one or more NMOS transistors for coupling with the second system. A switch module is coupled to the output stage module for selectively providing the PMOS and NMOS transistors with various gate biases. A feedback circuit is coupled between an I/O pad that couples the output stage module to the second system and the switch module for controlling the switch module to generate the gate biases in response to a voltage at the I/O pad, thereby ensuring voltages across gates of the PMOS and NMOS transistors to be within a predetermined range.

The construction and method of operation of the invention, however, together with additional objectives and advantages thereof will be best understood from the following description of specific embodiments when read in connection with the accompanying drawings.

DESCRIPTION

Figure 1:
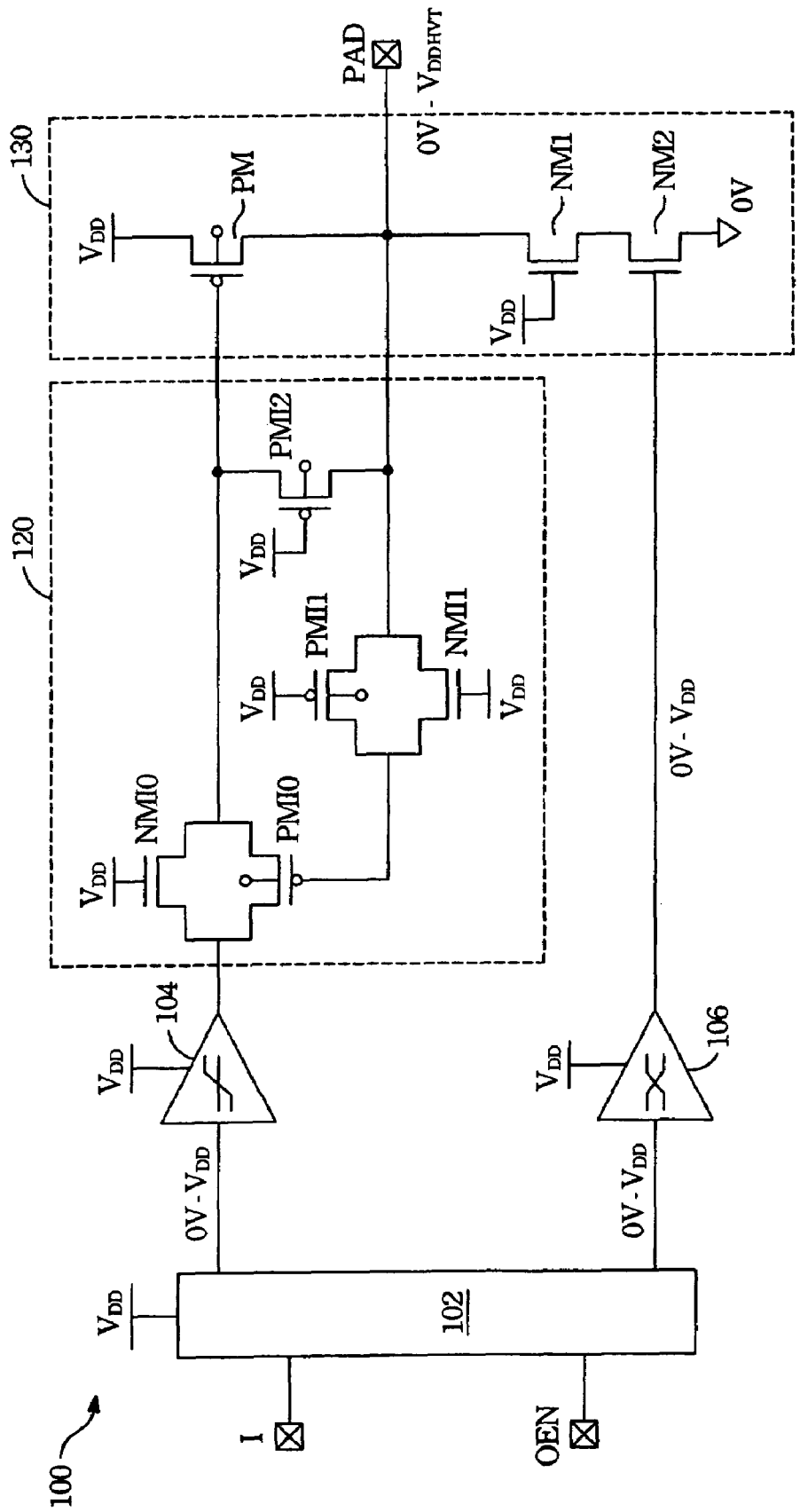
FIG. 1 illustrates a conventional single gate oxide I/O circuit.

FIG. 1 illustrates a conventional single gate oxide I/O circuit 100. The single gate oxide I/O circuit 100 includes a pre-driver circuit 102 that is connected to a supply voltage of VDD. The pre-driver is coupled to the inputs I and OEN for generating outputs ranging from 0V to VDD. The outputs of the pre-driver form inputs to the PMOS driver 104 and the NMOS driver 106. The PMOS driver 104 and the NMOS driver 106 are both connected to VDD. The output stage 130 includes a PMOS transistor PM1 and two NMOS transistors NM1 and NM2 connected in stacked configuration. The source of the PMOS transistor PM1 is connected to VDD and the drain is connected to the drain of NMOS transistor NM1 and PAD. The source of NMOS transistor NM2 is connected to ground.

It is assumed that VDDHVT, the high voltage at PAD, is three times VDD. When the NMOS driver 106 and the PMOS driver 104 output 0V, the NMOS transistor NM2 is turned off and the PMOS transistor PM1 is turned on. Because the gate of NMOS NM1 is coupled to VDD, the drain of the NMOS transistor NM2 will be charged to about VDD-Vtn, where Vtn is the threshold voltage of the NMOS transistor NM2. When VDDHVT is present at PAD, the gate oxide stress voltages are as follows. For NMOS transistor NM2, the voltage Vgd between its gate and drain is VDD-Vtn, the voltage Vgs between its gate and source is 0V. However, for NMOS transistor NM1, the voltage Vgd between its gate and drain is 2*VDD, which is higher than the typical break down voltage of NMOS transistor NM1 of about one VDD. The 2*VDD voltage can damage the NMOS transistor NM1 due to overstress. Thus, while the conventional I/O circuit 100 is a single gate oxide design, it cannot tolerate high voltage stress.

Figure 2:
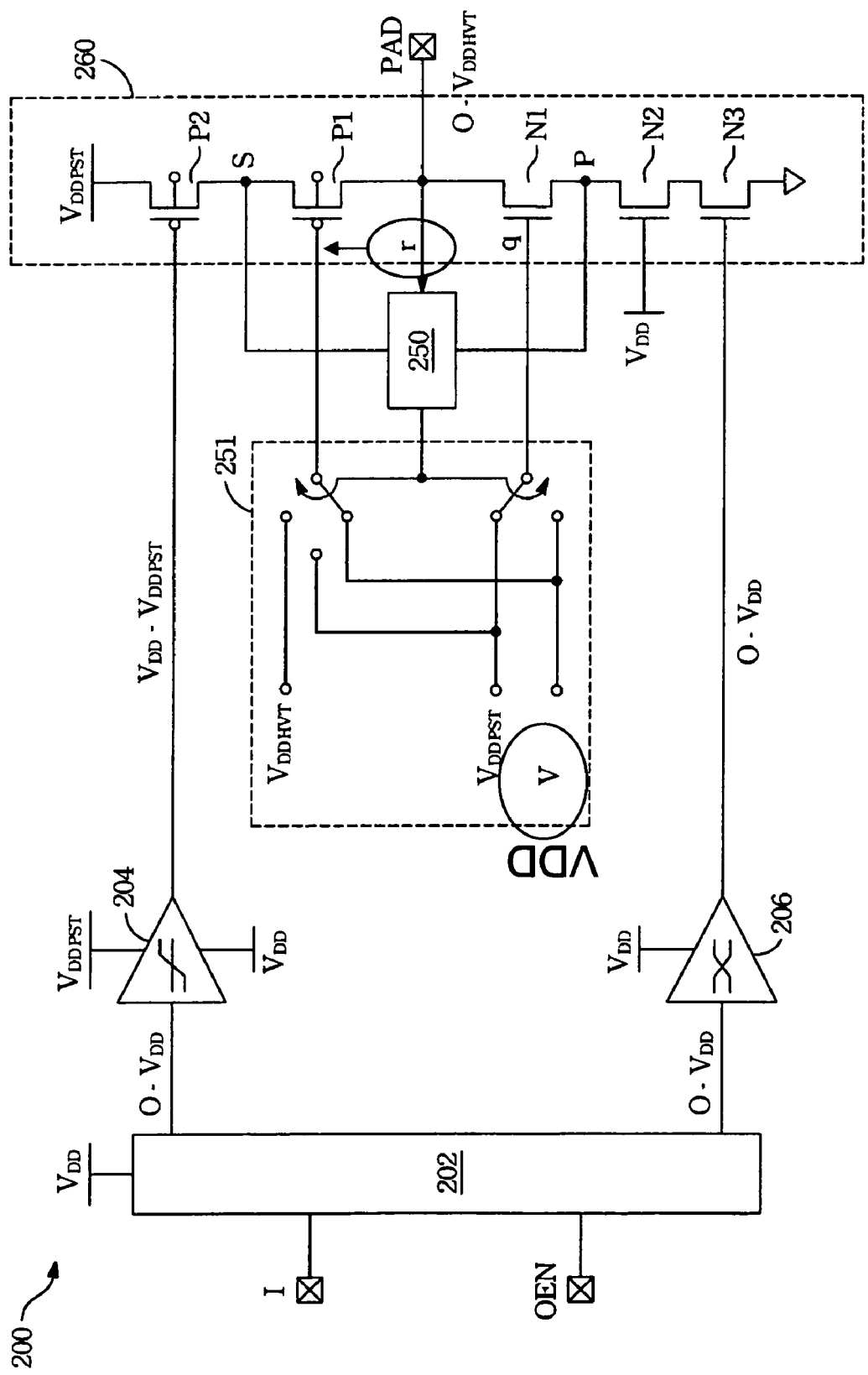
FIG. 2 illustrates a single gate oxide I/O output circuit with high voltage stress tolerance in accordance with one embodiment of the present invention.

FIG. 2 schematically illustrates a single gate oxide I/O output circuit 200 in accordance with one embodiment of the present invention. The circuit 200 includes a pre-driver circuit 202, PMOS driver 204, NMOS driver 206, a feedback circuit 250 and a cascaded output stage 260. The voltage VDDPST is higher than the supply voltage VDD, and the high voltage VDDHVT is higher than the voltage VDDPST. For example, the voltage VDDPST is twice the supply voltage VDD and the high voltage VDDHVT at PAD is thrice the supply voltage VDD. The pre-driver circuit 202 is connected to VDD. The pre-driver 202 is coupled to the inputs I and OEN for generating outputs that are between the 0V and VDD. The outputs of the pre-driver 202 form inputs to the PMOS driver 204 and the NMOS driver 206. The PMOS driver 204 is connected to VDDPST and VDD, and the NMOS driver 206 is connected to VDD and ground.

The output stage 260 includes the PMOS transistors P1, P2 and the NMOS transistors N1, N2, N3 connected in a stacked configuration. The source of the PMOS transistor P2 is connected to VDDPST and the drain is connected to the source of PMOS transistor P1, forming the circuit sense node "s." The drain of PMOS transistor P1 and NMOS transistor N1 are connected to PAD. The source of NMOS transistor N1 is connected to the drain of NMOS transistor N2, forming the circuit sense node "p." The source of NMOS transistor N2 and the drain of NMOS transistor N3 are connected together. The source of NMOS transistor N3 is connected to VSS, such as ground or 0V. The gate of NMOS transistor N3 is connected to the output of NMOS driver 206. The gate of NMOS transistor N2 is connected to VDD. The gate of NMOS transistor N1 is controlled by "q" the output of a switch module 251 controlled by the feedback circuit 250. The gate of PMOS transistor P2 is connected to the output of the PMOS driver 204. The gate of the PMOS transistor P1 is controlled by "r" the output of the switch module 251 controlled by the feedback circuit 250.

The feedback circuit 250 controls the switch module 251 to generate gate biases of various voltages based on the output of the I/O output circuit 200. The feedback circuit 250 is connected to the circuit sense nodes "p," "q," "r," "s," and PAD. The node "r" selectively controls the gate bias of the PMOS transistor P1 among VDD, VDDPST and VDDHVT, and the output "q" selectively controls the gate bias of the NMOS transistor N1 between VDD and VDDPST. As such, the voltage differences across the gate oxides of the PMOS transistor P1 and the NMOS transistor N1 can be controlled within a predetermined range, thereby preventing damage induced by overstress.

The following scenarios explain the operation of the circuit. In the first scenario, the PMOS driver 204 outputs VDDPST to the gate of the PMOS transistor P2, and the NMOS driver 206 outputs VDD to the gate of the NMOS transistor N3. The voltage at the circuit sense node "p" becomes zero because the NMOS transistors N2 and N3 are turned on. The feedback circuit 250 controls the switch module 251 to output VDD to the circuit sense nodes "q," "r," and "s" in response to the zero voltage at the circuit sense node "p." When the circuit sense node "q" is at VDD, the NMOS transistor N1 is turned on, thereby pulling the voltage at the PAD to zero. The PMOS transistor P2 is turned off because its gate and source are at the same voltage level VDDPST. Likewise, the PMOS transistor P1 is turned off because its gate and source are at the same voltage level VDD. As such, the voltage differences across the gate oxides of all the MOS transistors in the output stage 260 can be controlled within VDD, thereby preventing the same form damage induced by high voltage stress.

In the second scenario, the PMOS driver 204 outputs VDD to the gate of the PMOS transistor P2, and the NMOS driver 206 outputs 0V to the gate of the NMOS transistor N3. This causes the PMOS transistor P2 to turn on, and the voltage at the circuit sense node "s" to become VDDPST. The feedback control circuit 250 controls the switch module 251 to output VDD to the circuit sense node "r," and VDDPST to nodes "p" and "q," in response to the VDDPST at the node "s." This turns on the PMOS transistor P1 and turns off the NMOS transistors N1, N2 and N3, thereby outputting VDDPST at PAD. As such, the voltage differences across the gate oxides of all the MOS transistors in the output stage 260 can be controlled within VDD, thereby preventing the same form damage induced by high voltage stress.

Figure 3:
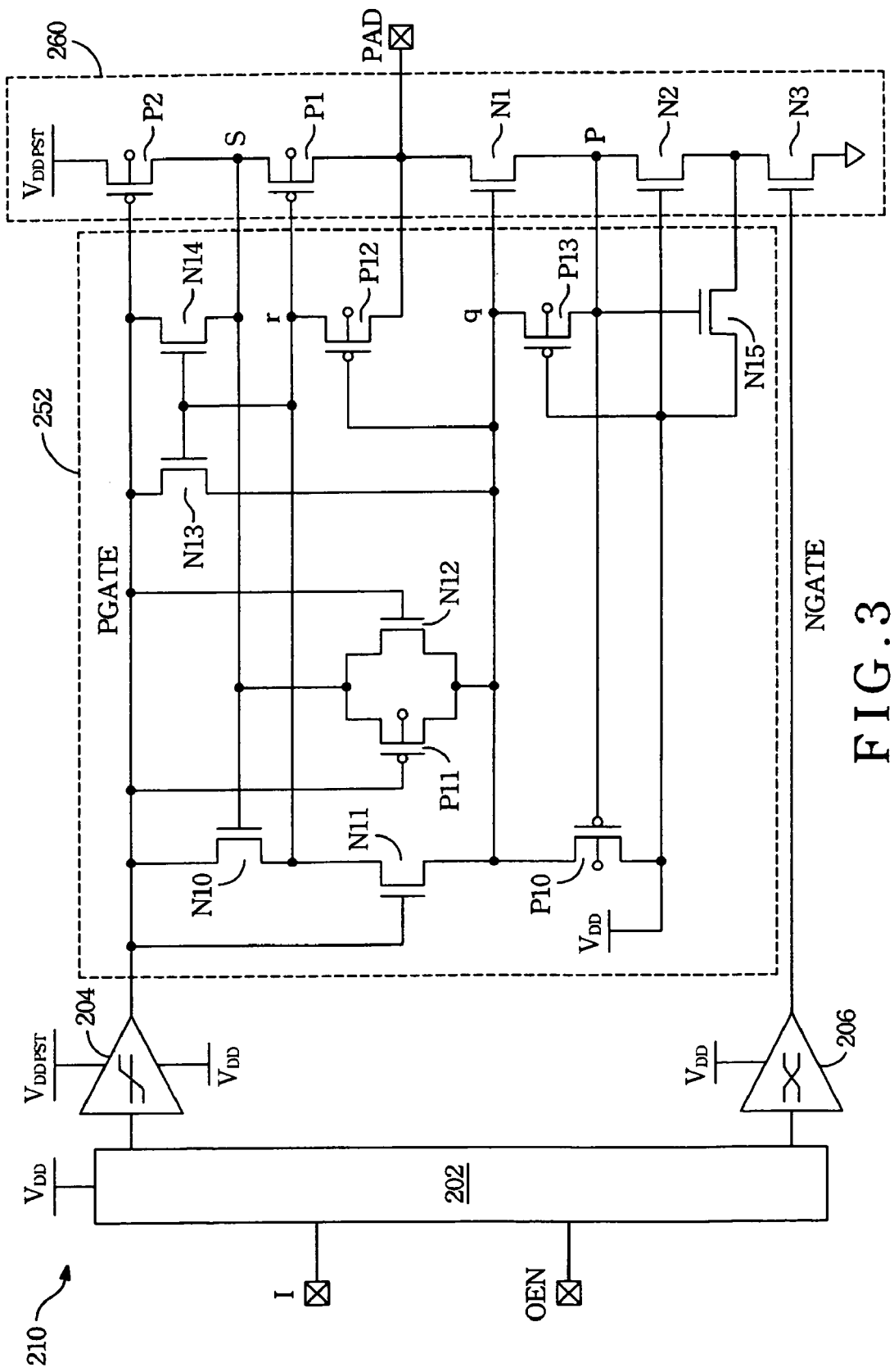
FIG. 3 illustrates a single gate oxide I/O output circuit with its switch module schematically illustrated in detail in accordance with another embodiment of the present invention.

FIG. 3 schematically illustrates the single gate oxide I/O output circuit 210 with the switch module and feedback circuit illustrated in detail in accordance with another embodiment of the present invention. The circuit 210 includes a pre-driver circuit 202, PMOS driver 204, NMOS driver 206, a feedback circuit 252, which incorporates the functions of the switch module 251 and the feedback circuit 250 shown in FIG. 2, and a cascaded output stage 260. The pre-driver 202 is coupled to the inputs I and OEN for generating outputs that are between the 0V and VDD. The outputs of the pre-driver 202 form inputs to the PMOS driver 204 and the NMOS driver 206. The PMOS driver 204 is connected to voltages VDDPST and VDD, and the NMOS driver 206 is connected to voltages VDD and 0V.

The feedback circuit 252 includes PMOS transistors P10, P11, P12 and P13, and NMOS transistors N10, N11, N12, N13, N14 and N15. The feedback circuit 252 is coupled to the circuit sense nodes "p," "q," "r," "s," and PAD. The feedback circuit 252 can be better understood by learning its operation. Assume that the output voltage PGATE of the PMOS driver 204 is VDDPST and the output voltage NGATE of the NMOS driver 206 is VDD. When the output voltage NGATE is VDD, the NMOS transistor N3 is turned on and that causes a 0V at the drain of the NMOS transistor N3 that is connected to the source of the NMOS transistor N2. The NMOS transistor N2 is also turned on by VDD, thereby pulling the circuit sense node "p" to 0V. The gate of PMOS transistor P10 is at 0V and its source is tied to VDD so that PMOS transistor P10 is turned on and changes the voltage at the circuit sense node "q" to VDD. The circuit sense node "q" is connected to the gate of NMOS transistor N1 and together with circuit sense node "p" at 0V connected to its source, such that the NMOS transistor N1 is turned on and propagates 0V to PAD. The NMOS transistor N11 is forward biased as its gate is at VDDPST and source at VDD, and propagates VDD to the circuit sense node "r." The NMOS transistor N12 is forward biased as its source is at VDD and its gate is at VDDPST, and propagates VDD to the circuit sense node "s." Thus NMOS transistor N12 ensures that the drain to source voltage Vds of the PMOS transistor P1 is no more than VDD when the PAD is 0V and the voltage at circuit sense node "s" is VDD.

When the output voltage PGATE of the PMOS driver 204 is VDD and the output voltage NGATE of the NMOS driver 206 is 0V, the PMOS transistor P2 is forward biased and the voltage at circuit sense node "s" becomes VDDPST. This results in NMOS transistor's (N10) turning on and propagating VDD on to the circuit sense node "r." The PMOS transistor P1 of the output stage is forward biased and propagates voltage VDDPST to PAD. The PMOS transistor P11 is turned on and the voltage at circuit sense node "q" becomes VDDPST. The PMOS transistor P11 isolates "q" and "s" to avoid transient overstress on PAD. The PMOS transistor P13 is turned on and propagates voltage VDDPST to the circuit sense node "p." The NMOS transistor N15 and the PMOS transistor P13 ensure that the drain to source voltage of NMOS transistor N1 is no more than VDD (VDDHVT−VDDPST) when PAD is at the high voltage VDDHVT.

The output voltage at the circuit sense node "r" of the feedback circuit 252 controls the gate bias of the PMOS transistor P1 among VDD, VDDPST and VDDHVT and the output voltage at circuit sense node "q" of the feedback circuit 252 controls the gate bias of the NMOS transistor N1 among VDD and VDDPST. This gate swing range ensures that the gate to source voltage Vgs and the gate to drain voltage Vgd of all the transistors in the output stage are below VDD, thereby avoiding over stress on the gates.

Figure 4:
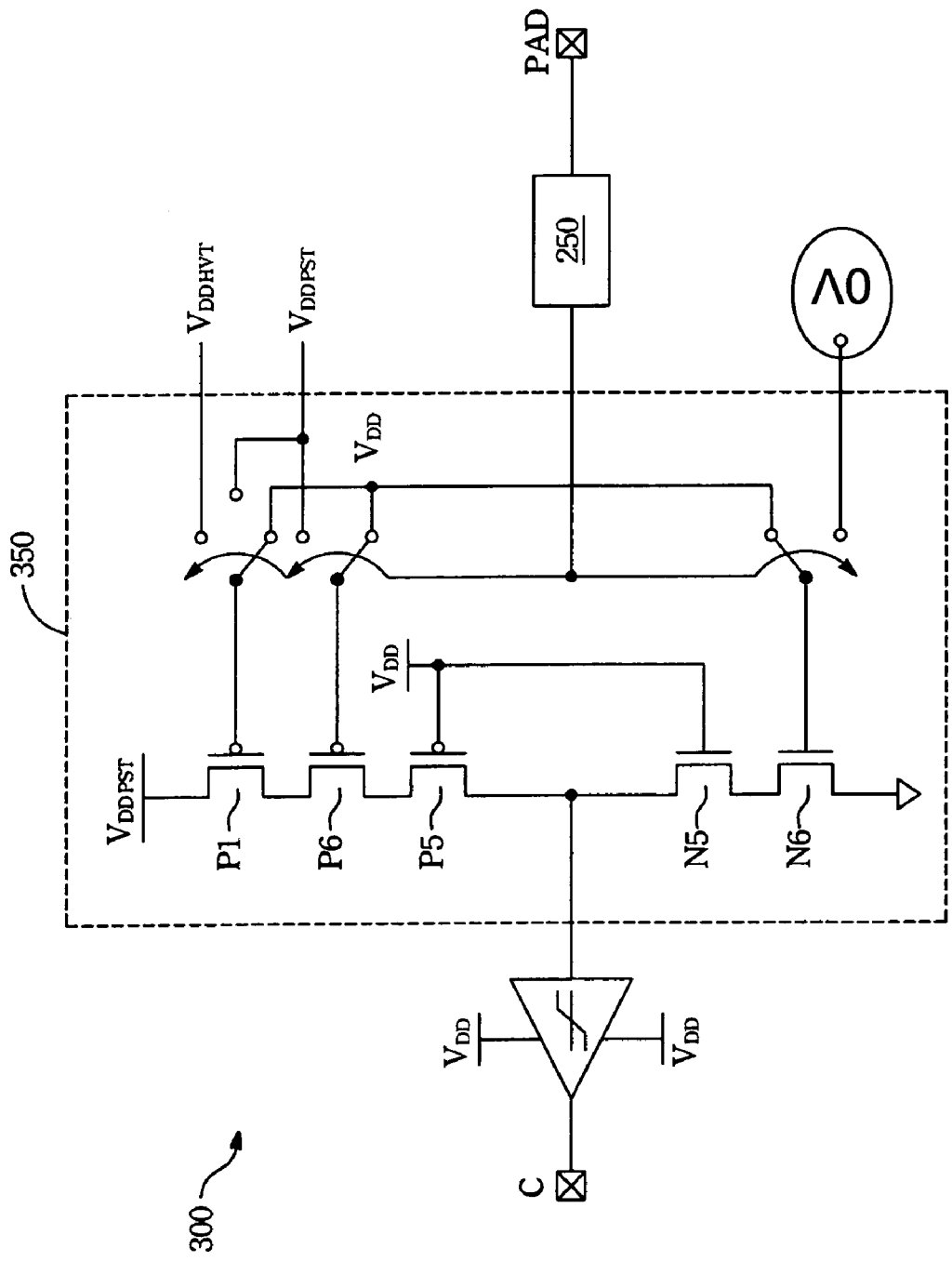
FIG. 4 illustrates a single gate oxide I/O input circuit with high voltage stress tolerance in accordance with one embodiment of the present invention.

FIG. 4 schematically illustrates a single gate oxide I/O input circuit 300 in accordance with another embodiment of the present invention. The circuit 300 includes a PAD, a feedback circuit 250, an input stage 350, which incorporates the function of a switch module. In the circuit 300, the voltage VDDPST is set to be twice the supply voltage VDD and the voltage VDDHVT is set to be thrice the supply voltage VDD.

The cascaded input stage 350 includes PMOS transistors P5, P6, P7 and NMOS transistors N5, N6. The drains of PMOS transistor P5 and NMOS transistor N5 are connected to an internal circuit (not shown in the figure). The source of PMOS transistor P5 is connected to the drain of PMOS transistor P6, and the source of PMOS transistor P6 is connected to the drain of PMOS transistor P7. The source of PMOS transistor P7 is tied to the supply voltage VDDPST. The source of NMOS transistor N5 is connected to the drain of NMOS transistor N6 and the source of NMOS transistor N6 is connected to VSS, such as ground or 0V. The gates of PMOS transistor P5 and NMOS transistor N5 are connected to VDD. The voltage at the gate of NMOS transistor N6 is controlled by the feedback circuit 250 and is switching between 0V and VDD. The voltage at the gate of PMOS transistor P6 is controlled by the feedback circuit 250 and is switching between VDD and VDDPST. The voltage at the gate of the PMOS transistor P7 is also controlled by the feedback circuit 250 and is switching among VDD, VDDPST and VDDHVT. This gate swing range ensures that the gate to source voltage Vgs and the gate to drain voltage Vgd of all the transistors in the input stage 350 are below VDD, thereby avoiding overstress on the gates.

Figure 5:
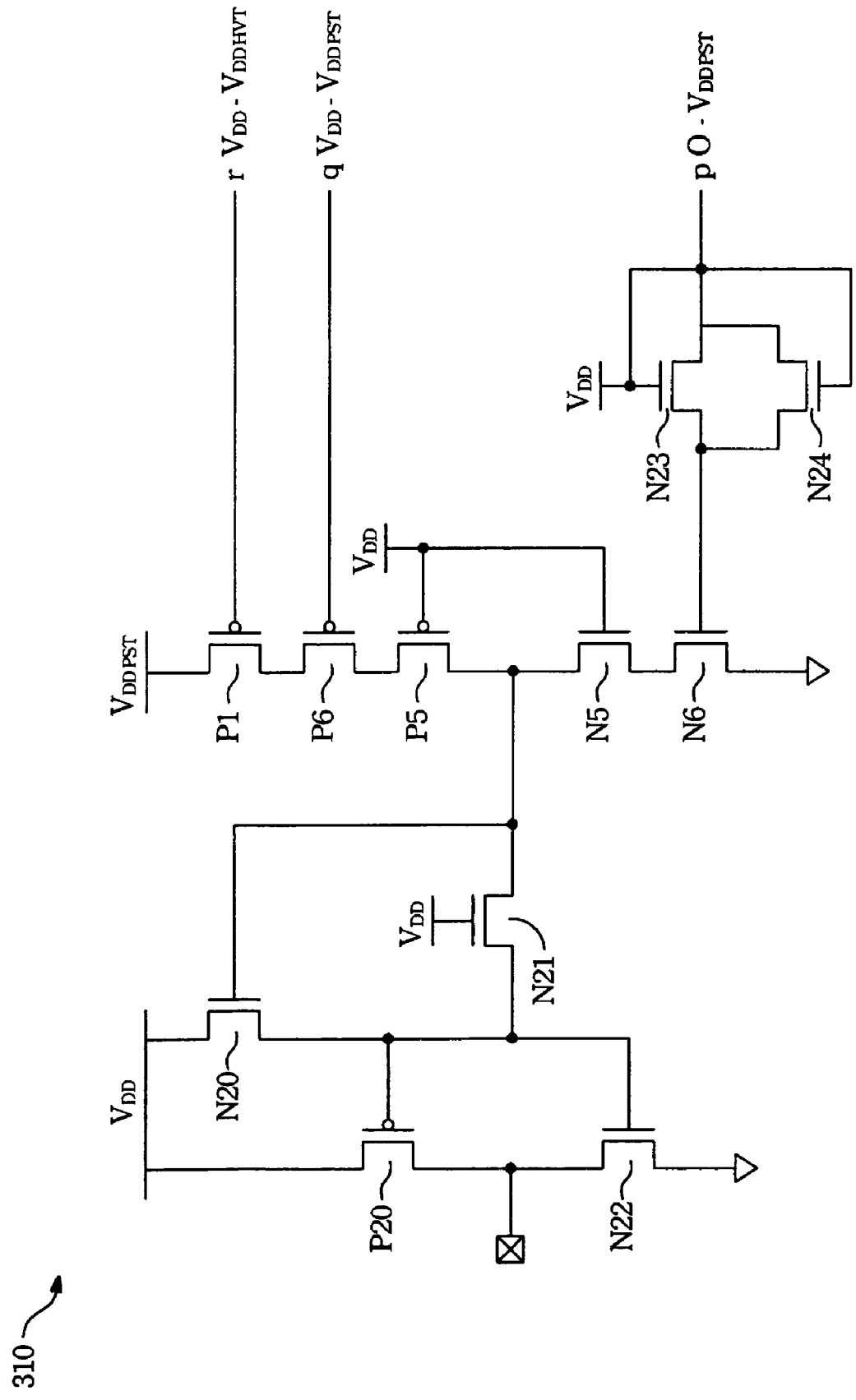
FIG. 5 illustrates a single gate oxide I/O input circuit with its switch module schematically illustrated in detail in accordance with another embodiment of the present invention.

FIG. 5 illustrates the circuit 310 of single gate oxide I/O input circuit, which is the schematic implementation of the circuit 300 shown in FIG. 4, in accordance with another embodiment of the present invention. The cascaded input stage includes PMOS transistors P5, P6, P7 and NMOS transistors N5, N6. The drains of PMOS transistor P5 and NMOS transistor N5 are connected to an internal circuit. The source of PMOS transistor P5 is connected to the drain of PMOS transistor P6 and the source of PMOS transistor P6 is connected to the drain of PMOS transistor P7. The source of PMOS transistor P7 is tied to the supply voltage VDDPST. The source of NMOS transistor N5 is connected to the drain of NMOS transistor N6 and the source of NMOS transistor N6 is connected to VSS, such as ground or 0V. The gates of PMOS transistor P5 and NMOS transistor N5 are connected to the supply voltage VDD. The voltage at the gate of NMOS transistor N6 is controlled by the circuit sense node "p" of the feedback circuit (not shown in the figure) via NMOS transistors N23 and N24, and is switching between 0V and voltage VDDPST. The voltage at the gate of PMOS transistor P6 is controlled by the circuit sense node "q" of the feedback circuit, and is switching between VDD and VDDPST. The voltage at the gate of the PMOS transistor P7 is controlled by the circuit sense node "r" of the feedback circuit, and is switching among VDD, VDDPST and VDDHVT. The internal circuit, which includes the PMOS transistor P20 and NMOS transistors N20, N21, N22, ensures that the voltage reaching the internal circuit is always between 0V and VDD. The gate swing range of the PMOS transistors P5, P6, P7 and the NMOS transistors N5 and N6 are controlled in a predetermined range, such that the gate to source voltage Vgs and the gate to drain voltage Vgd of all the transistors are below VDD, thereby avoiding over stress on the gates.

The table below shows the voltages at the circuit sense nodes for the proposed I/O output and input circuits. As it can be seen from the table, the gate to source voltage Vgs and the gate to drain voltage Vgd of all the transistors is below VDD at all times so that the signal gate oxide transistors used in the I/O stage can tolerate the high voltage stress.

|  | Output 0 | Output VDDPST | Input 0 | Input VDDPST | Input VDDHVT |
| --- | --- | --- | --- | --- | --- |
| NGATE | VDD | 0 | 0 | 0 | 0 |
| PGATE | VDDPST | VDD | VDDPST | VDDPST | VDDPST |
| PAD | 0 | VDDPST | 0 | VDDPST | VDDHVT |
| p | 0 | VDDPST | 0 | VDDPST-Vtn | VDDPST |
| q | VDD | VDDPST | VDD | VDDPST-Vtn | VDDPST |
| r | VDD | VDD | VDD | VDDPST | VDDHVT |
| s | VDD | VDDPST | VDD | VDDPST-Vtn | VDDPST |

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. An I/O output circuit for interfacing a first system operating at a first voltage with a second system operating at a second voltage higher than the first voltage, comprising:
   an output stage module having one or more PMOS transistors and one or more NMOS transistors for coupling with the second system;
   a switch module coupled to the output stage module for selectively providing the PMOS and NMOS transistors with various gate biases; and
   a feedback circuit coupled between an I/O pad that couples the output stage module to the second system and the switch module for controlling the switch module to generate the gate biases in response to a voltage at the I/O pad, thereby ensuring voltages across gates of the PMOS and NMOS transistors to be within a predetermined range,
   wherein the output stage module comprises a first PMOS transistor and a second PMOS transistor serially coupled between the I/O pad and a third voltage that is higher than the first voltage but lower than the second voltage.

2. The I/O output circuit of claim 1 wherein the second PMOS transistor has a source coupled to the third voltage, a drain coupled to a source of the first PMOS transistor, and a gate coupled to an output terminal of a PMOS driver that generates an output ranging from the first voltage to the third voltage.

3. The I/O output circuit of claim 2 wherein the first PMOS transistor has a source coupled to the drain of the second PMOS transistor, a drain coupled to the I/O pad, and a gate controlled by one of the gate biases generated by the switch module.

4. The I/O output circuit of claim 3 wherein the output stage module comprises a first NMOS transistor, second NMOS transistor, and third NMOS transistor serially coupled between the I/O pad and ground, with the first NMOS transistor coupled to the I/O pad, the third NMOS transistor coupled to ground, and the second NMOS transistor coupled between the first and third NMOS transistors.

5. The I/O output circuit of claim 4 wherein a gate of the first NMOS transistor is controlled by one of the gate biases generated by the switch module, a gate of the second NMOS transistor is connected to the first voltage, and a gate of the third NMOS transistor is connected to an output terminal of an NMOS driver that generates an output ranging from ground to the first voltage.

6. The I/O output circuit of claim 5 wherein the feedback circuit has a first terminal coupled to the source of the first PMOS transistor, and a second terminal coupled to the source of the first NMOS transistor.

7. The I/O output circuit of claim 6 wherein the feedback circuit controls the switch module to generate a first voltage to the gate of the first PMOS transistor and the gate of the first NMOS transistor when the I/O pad is at ground voltage.

8. The I/O output circuit of claim 7 wherein the feedback circuit controls the switch module to generate a first voltage to the gate of the first PMOS transistor, and a third voltage to the gate of the first NMOS transistor when the I/O pad is at the third voltage.

9. The I/O output circuit of claim 1 wherein the gate biases generated by the switch module switch among the first, second and third voltages.

10. An I/O output circuit for interfacing a first system operating at a first voltage with a second system operating at a second voltage higher than the first voltage, comprising:
    an output stage module having one or more PMOS transistors and one or more NMOS transistors for coupling with the second system;
    a switch module coupled to the output stage module for selectively providing the PMOS and NMOS transistors with various gate biases switching among the first voltage, the second voltage, and a third voltage that is higher than the first voltage but lower than the second voltage; and
    a feedback circuit coupled between an I/O pad that couples the output stage module to the second system and the switch module for controlling the switch module to generate the gate biases in response to a voltage at the I/O pad,
    wherein the gate bias for one of the PMOS transistors is at the first voltage and the gate bias for one of the NMOS transistors is at the first voltage, when the I/O pad is at ground voltage,
    wherein the gate bias for one of the PMOS transistors is at the first voltage and the gate bias for one of the NMOS transistors is at the third voltage, when the I/O pad is at the third voltage.

11. The I/O output circuit of claim 10 further comprising a PMOS driver coupled to one of the PMOS transistors in the output stage module for generating an output ranging from the first voltage to the third voltage, and a NMOS driver coupled to one of the NMOS transistors in the output stage module for generating an output ranging from ground to the first voltage.

* * * * *